(12) United States Patent
Bertrand

(10) Patent No.: US 12,198,882 B2
(45) Date of Patent: Jan. 14, 2025

(54) METHOD AND DEVICE FOR MONITORING THE OPERATING STATE OF CIRCUIT BREAKERS

(71) Applicant: SMARTFUTURE, Pierrefeu du Var (FR)

(72) Inventor: Paul Bertrand, Pierrefeu du Var (FR)

(73) Assignee: Smartfuture, Pierrefeu du Var (FR)

( * ) Notice: Subject to any disclaimer, the term of this patent is extended or adjusted under 35 U.S.C. 154(b) by 76 days.

(21) Appl. No.: 18/251,057

(22) PCT Filed: Oct. 21, 2021

(86) PCT No.: PCT/FR2021/051847
§ 371 (c)(1),
(2) Date: Apr. 28, 2023

(87) PCT Pub. No.: WO2022/090648
PCT Pub. Date: May 5, 2022

(65) Prior Publication Data
US 2023/0377823 A1 Nov. 23, 2023

(30) Foreign Application Priority Data
Nov. 2, 2020 (FR) ........................................ 2011228

(51) Int. Cl.
*G08B 17/00* (2006.01)
*G01R 15/20* (2006.01)
(Continued)

(52) U.S. Cl.
CPC ........... *H01H 71/04* (2013.01); *G01R 15/207* (2013.01); *G01R 33/0076* (2013.01);
(Continued)

(58) Field of Classification Search
CPC ............. H01H 71/04; H01H 2071/044; H01H 2011/0068; G01R 15/207; G01R 33/0076;
(Continued)

(56) References Cited

U.S. PATENT DOCUMENTS

2013/0229173 A1 9/2013 Bertrand
2016/0187449 A1* 6/2016 Beiner ................. G01R 15/207
324/74
(Continued)

FOREIGN PATENT DOCUMENTS

CN 107978495 A 5/2018
EP 2637027 A1 9/2013

OTHER PUBLICATIONS

International Preliminary Search Report on Patentability dated May 11, 2023, issued in PCT Application No. PCT/FR2021/051847, filed Oct. 21, 2021.
(Continued)

*Primary Examiner* — Toan N Pham
(74) *Attorney, Agent, or Firm* — Workman Nydegger

(57) ABSTRACT

A method for monitoring the operating state of a set of circuit breakers includes the steps of arranging on the wall of each circuit breaker a synchronous triaxial digital magnetometer on a semiconductor chip, cyclically and synchronously reading temperatures measured by the magnetometers and from the temperatures measured by the magnetometers and a value of the ambient temperature, determining, for each circuit breaker, whether an internal heating temperature of the circuit breaker reaches a first temperature threshold which may be representative of an anomaly of the operating state of the circuit breaker.

21 Claims, 4 Drawing Sheets

(51) Int. Cl.
    *G01R 33/00*         (2006.01)
    *G01R 33/02*         (2006.01)
    *G01R 33/028*      (2006.01)
    *H01H 71/04*         (2006.01)

(52) U.S. Cl.
    CPC ..... *G01R 33/0206* (2013.01); *G01R 33/0286* (2013.01); *H01H 2071/044* (2013.01)

(58) Field of Classification Search
    CPC ........................ G01R 33/0206; G01R 33/0286; G01R 33/02; H02H 5/044; H02H 1/00
    See application file for complete search history.

(56) References Cited

U.S. PATENT DOCUMENTS

| | | | |
|---|---|---|---|
| 2016/0188763 A1* | 6/2016 | Beiner | ................... G01D 4/00 703/18 |
| 2018/0070897 A1 | 3/2018 | Kravis et al. | |
| 2022/0209821 A1* | 6/2022 | Eriksen | ............... H02H 1/0092 |

OTHER PUBLICATIONS

International Search Report and Written Opinion dated Feb. 8, 2022, issued in PCT Application No. PCT/FR2021/051847, filed Oct. 21, 2021 (partial translation).

\* cited by examiner

METHOD AND DEVICE FOR MONITORING THE OPERATING STATE OF CIRCUIT BREAKERS

BACKGROUND OF THE INVENTION

1. The Field of the Invention

The present invention relates to a method and apparatus for monitoring the operating status of a circuit breaker assembly.

2. The Relevant Technology

It is known that an excessive rise in the temperature of a circuit breaker is a sign of an electrical fault and can be a precursor of a future failure that could lead to the destruction of the circuit breaker and consequently the inopportune shutdown of the equipment that the circuit breaker supplies with power. In the case of commercial or industrial installations, such a shutdown of equipment, for example a refrigeration unit or a fire monitoring system, can lead to significant production and financial losses, or affect the safety of the installations. A high temperature of a circuit breaker may be indicative of an internal fault in the circuit breaker, a wiring error, such as a loose wire, a poorly installed switchboard, such as the use of undersized wires, or a fault in the equipment to which the circuit breaker supplies power, which results in a high current flow but does not cause the circuit breaker to break. It is therefore particularly recommended to check the condition of a set of circuit breakers from time to time by measuring their temperatures.

For this purpose, there are various so-called "non-intrusive" techniques, such as thermal imaging, which only provide an instantaneous status of the temperature of a circuit breaker and do not allow a permanent control thereof. These techniques also require expensive installations or the intervention of specialized technicians on site, which is also costly.

It may therefore be desirable to provide a simple and inexpensive means of monitoring the temperature of a set of circuit breakers in short time intervals, for example on the order of seconds, in order to anticipate the occurrence of problems.

Document EP2637027 describes a method and a device for measuring the current flowing through a circuit breaker comprising a protection coil and a wall traversed by a magnetic field emitted by the protection coil. According to this method, a synchronous triaxial digital magnetometer on a semiconductor chip is arranged on the wall of the circuit breaker. By means of the magnetometer, at least one component of the magnetic field emitted by the protection coil is measured, in order to deduce the value of a current flowing through the circuit breaker. In an electrical panel comprising a set of circuit breakers, a magnetometer is arranged on each circuit breaker, which makes it possible to measure the current line by line and thus to monitor the electrical consumption of the installation station by station.

It may also be desired to provide a means of monitoring the temperature evolution over time of a set of circuit breakers fitted with such an individual current measuring device.

SUMMARY OF THE INVENTION

Thus, embodiments of the invention relate to a method of monitoring the operating state of a set of circuit breakers, each circuit breaker comprising a protective coil and having a wall through which a magnetic field emitted by the coil passes, the method comprising the steps of arranging on the wall of each circuit breaker a synchronous triaxial digital magnetometer on a semiconductor chip, each magnetometer comprising magnetic field measuring means and an internal temperature sensor, and a data output for providing magnetic field and temperature measurements, cyclically and synchronously reading, at successive times, the temperatures provided by the magnetometers, from the temperatures measured by the magnetometers and a value of the ambient temperature, determining, for each circuit breaker, whether an internal heating temperature of the circuit breaker reaches a first temperature threshold which may be representative of an anomaly in the operating state of the circuit breaker, and emitting an alarm of a first type when the internal heating temperature of at least one circuit breaker reaches the first temperature threshold.

According to an embodiment, the value of the ambient temperature is estimated from the temperatures measured by the magnetometers.

According to an embodiment, the value of the ambient temperature is selected from the following values: an average value of the temperatures measured at the same time by the magnetometers, a weighted average value of the temperatures measured at the same time by the magnetometers, the lowest of the temperatures measured at the same time by the magnetometers, and a combination of at least two of the three previous values.

According to an embodiment, the method comprises at least the first of the following two steps: for each magnetometer and circuit breaker associated with the magnetometer, subtracting the ambient temperature value from each temperature measured by the magnetometer, to obtain a first estimate of the internal heating temperature of the circuit breaker, and for each magnetometer and circuit breaker associated with the magnetometer, subtracting from each first estimate of the internal heating temperature of the circuit breaker, the mean value of a plurality of estimates of the internal heating temperature of the circuit breaker calculated at different times, in order to obtain a second estimate of the internal heating temperature of the circuit breaker.

According to an embodiment, the method comprises the steps of determining, for each circuit breaker, whether the internal heating temperature of the circuit breaker reaches a second temperature threshold, and emitting an alarm of a second type if the internal heating temperature reaches a second temperature threshold higher than the first temperature threshold.

According to an embodiment, the method comprises the steps of cyclically and synchronously reading, at successive times, the values of at least one component of the magnetic field measured by each magnetometer, representative of the field emitted by the coil of the circuit breaker with which each circuit breaker is associated, and evaluating the value of a current flowing through each circuit breaker from the measured magnetic field component.

According to an embodiment, the alarm of the first type is issued only if the circuit breaker has a current flowing through it that is less than a current threshold for which its internal heating temperature should not exceed the first temperature threshold.

According to an embodiment, when the internal heating temperatures of two adjacent circuit breakers each reach the first temperature threshold, the alarm of the first type is not issued for the one of the two circuit breakers that has not had any current flowing through it for a determined time.

According to an embodiment, the method comprises the following steps for each circuit breaker: cyclically evaluating the current flowing through the circuit breaker, evaluating, in an observation time window of a few hours to a few days, a rate of operation of the circuit breaker which is a function of the number of periods when the circuit breaker is crossed by a current, and the duration of each of these periods, monitoring the variation of the rate of operation of the circuit breaker within the observation time window, and issuing an alarm of a third type indicating a possible malfunction of equipment electrically supplied by the circuit breaker if the variation of the rate of operation of the circuit breaker exceeds a specified variation threshold.

According to an embodiment, the method comprises, when the conditions for issuing the first type alarm are met for two adjacent circuit breakers, a step of comparing the operating rates of each circuit breaker to identify the circuit breaker with the higher probability of abnormality of its operating state, the temperature rise of one of the circuit breakers being caused by the temperature rise of the other circuit breaker, and wherein the alarm of the first type is issued only for the circuit breaker having the highest probability of abnormality of its operating state.

According to an embodiment, issuing an alarm comprises one or a combination of the following actions: displaying information on a control screen, sending an electronic message to a recipient, activating an indicator light or triggering an audible alarm.

Embodiments of the invention also relate to a device for monitoring the operating state of a set of circuit breakers, each circuit breaker comprising a protective coil and having a wall through which a magnetic field emitted by the coil passes, the device comprising a set of synchronous triaxial digital magnetometers on semiconductor chips, each magnetometer being arranged on the wall of a circuit breaker and comprising magnetic field measuring means, an internal temperature sensor and a data output for providing magnetic field and temperature measurements, a control circuit connected to the magnetometers and configured to cyclically and synchronously read, at successive times, the temperatures measured by the magnetometers, from the temperatures measured by the magnetometers and a value of the ambient temperature, determine, for each circuit breaker, whether an internal heating temperature of the circuit breaker reaches a first temperature threshold which may be representative of an anomaly in the operating state of the circuit breaker, and emit an alarm of a first type when the internal heating temperature of at least one circuit breaker reaches the first temperature threshold.

According to an embodiment, the control circuit is configured to estimate the value of the ambient temperature from the temperatures measured by the magnetometers.

According to an embodiment, the control circuit is configured to perform at least the first of the following two steps, for each magnetometer and circuit breaker associated with the magnetometer: subtracting the ambient temperature value from each temperature measured by the magnetometer, to obtain a first estimate of the internal heating temperature of the circuit breaker, and subtracting from each first estimate of the internal heating temperature of the circuit breaker, the average value of a plurality of estimates of the internal heating temperature of the circuit breaker calculated at different times, in order to obtain a second estimate of the internal heating temperature of the circuit breaker.

According to an embodiment, the control circuit is configured to emit, in addition to the alarm of the first type, an alarm of a second type when the internal heating temperature of at least one circuit breaker reaches a second temperature threshold higher than the first temperature threshold.

According to an embodiment, the control circuit is configured to cyclically and synchronously read, at successive times, the values of at least one component of the magnetic field measured by each magnetometer, representative of the field emitted by the coil of the circuit breaker with which each circuit breaker is associated, evaluate the value of a current flowing through each circuit breaker from the measured magnetic field component.

According to an embodiment, the control circuit is configured to issue the alarm of the first type only if the circuit breaker has a current flowing through it that is less than a current threshold for which its internal heating temperature should not exceed the first temperature threshold.

According to an embodiment, when the estimated internal heating temperatures of two adjacent circuit breakers each reach the first temperature threshold, the control circuit is configured not to issue the alarm of the first type for the one of the two circuit breakers that has not had any current flowing through it for a determined time.

According to an embodiment, the control circuit is configured to perform the following steps for each circuit breaker: cyclically evaluating the current through the circuit breaker, calculating, in a sliding time window of observation at least equal to the last 24 hours, a rate of operation of the circuit breaker which is a function of the number of periods during which the circuit breaker is crossed by a current, and of the duration of each of these periods, monitoring the variation of the circuit breaker operating rate over time, within the sliding time window of observation, issuing a third type of alarm if the variation in the rate of operation of the circuit breaker exceeds a specified variation threshold.

According to an embodiment, when the conditions for issuing the first type alarm are met for two adjacent circuit breakers, the control circuit is configured to compare the operating rates of each circuit breaker to identify the circuit breaker with the higher probability of abnormality of its operating condition, wherein the temperature rise of one of the circuit breakers may be caused by the temperature rise of the other circuit breaker, and issue the first type alarm only for the circuit breaker having the highest probability of abnormality of its operating condition.

According to an embodiment, the control circuit is configured to issue an alarm by performing one or a combination of the following actions: displaying information on a control screen, sending an electronic message to a recipient, activating an indicator light, or triggering an audible alarm.

BRIEF DESCRIPTION OF THE DRAWINGS

Embodiments of a method and a device for monitoring the operating state of circuit breakers will be described non-limitingly in the following, in relation to the attached figures, among which.

DETAILED DESCRIPTION OF THE PREFERRED EMBODIMENTS

Embodiments of the present invention include the observation that there are commercially available triaxial digital magnetometers designed to measure the earth's magnetic field, such as those for the smartphone market to implement applications such as a software compass, a metal detector, a pure silver analyzer, etc. These MEMS (microelectromechanical systems) based magnetometers are integrated on a semiconductor chip and include, in addition to the earth's magnetic field sensors, an internal temperature sensor configured to measure the temperature of the semiconductor chip on which they are integrated. Such magnetometers also include a communication interface circuit capable of dialoguing with an external controller via a data bus, to provide temperature and magnetic field measurements. Such magnetometers can perform synchronous temperature measurements and synchronous magnetic field measurements through a synchronization input provided to receive an external synchronization signal.

Figure 1:
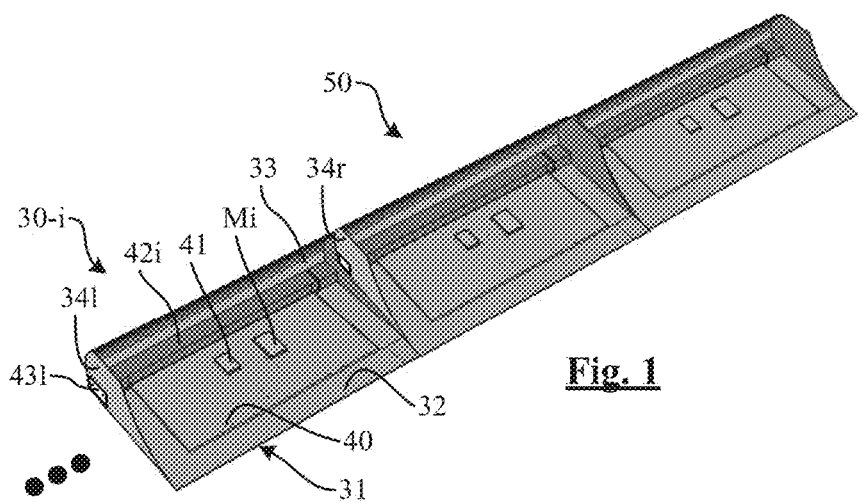
FIG. 1 shows a set of control modules according to the invention, for controlling circuit breakers.

FIG. 1 shows a set of control modules 30-$i$ of a control device 50 according to the invention, made from such triaxial synchronous magnetometers. The control modules 30-$i$ are identical and arranged next to each other. Each module 30-$i$ comprises a housing 31 including a base 32, a cover 33 extending in the extension of the base 32 and partially covering the latter, a left side wall 341 and a right side wall 34$r$. A printed circuit board 40 is arranged on the base 32. The printed circuit board 40 receives a triaxial digital magnetometer $M_i$, the contacts of the magnetometer housing being soldered on contact areas of the printed circuit board (not shown). Alternatively, the magnetometer $M_i$ may be flip-chip mounted on the printed circuit board. The printed circuit board also accommodates auxiliary electronic components shown schematically as a block 41, for example capacitors and resistors. The magnetometers $M_i$ are for example those marketed by the company STMicroelectronics under the reference LIS3MDL. They include two temperature sensor registers with addresses 2Eh and 2Fh providing a two-part temperature measurement that can be read with "TEMP_OUT_L (2Eh)" and "TEMP_OUT_H (2Fh)" commands.

Each module 30-$i$ has transverse conductor tracks 42-$i$, fabricated for example on the printed circuit board 40. These transverse tracks are covered by a protective cover in the example shown. The magnetometer $M_i$ is electrically connected to the transverse conductor tracks 42-$i$ via conductor tracks on the printed circuit board (not shown). The transverse conductor tracks 42-$i$ are electrically connected to a left connector 431 and a right connector (not shown) of module 30-1. The left connector 431 extends through the left sidewall 341 and the right connector extends through the right sidewall 34$r$. Each connector 431 cooperates or can cooperate electrically with the corresponding connector of an adjacent module 30-($i$+1) or 30-($i$−1), so that the transverse conductor tracks 42-$i$ of the different modules are interconnected and together form a data and power bus 42 to which all magnetometers $M_i$ are connected.

Figure 2A:
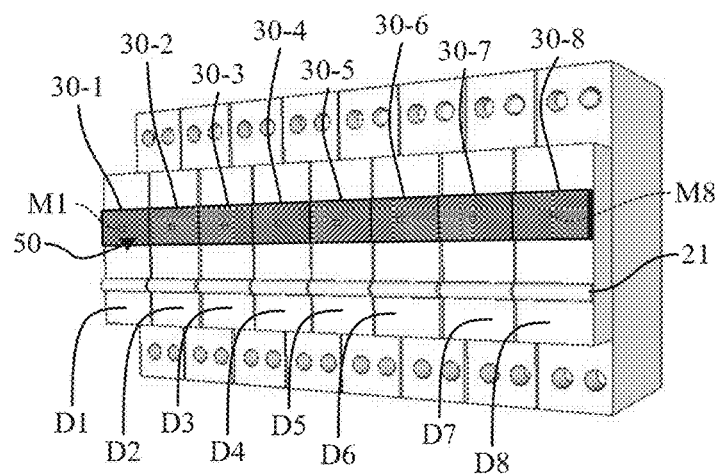
FIGS. 2A, 2B are perspective and profile views of a set of circuit breakers fitted with the control modules of FIG. 1.
Figure 2B:
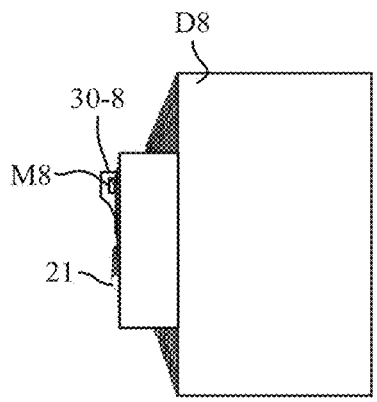

The FIGS. 2A and 2B represent, respectively in perspective and profile view, an embodiment of the control device 50 comprising here eight modules 30-$i$ (30-1 to 30-8) each comprising a magnetometer $M_i$ (M1 to M8). The modules 30-$i$ are arranged on a set of eight circuit breakers $D_i$ (D1 to D8) arranged side by side in an electrical panel, controlling branches of an electrical network. As shown in FIG. 2B, the rear face of the base of each module 30-$i$ (30-8 in the figure) is attached to the front face ("small face") of a circuit breaker $D_i$ (D8 in the figure), above the reset lever 21, for example by means of a double-sided adhesive preferably chosen to offer good thermal conductivity.

The open shape of the housing of each module $M_i$ allows a finger to be passed over the printed circuit board, for resetting a circuit breaker, the modules 30-$i$ being arranged above the reset lever 21. The reset lever 21, shown in FIG. 2B in the lower position, is in an upper position after the circuit breaker has been reset, where it extends over the printed circuit board of the module $M_i$ (M8 in the figure).

Figure 3:
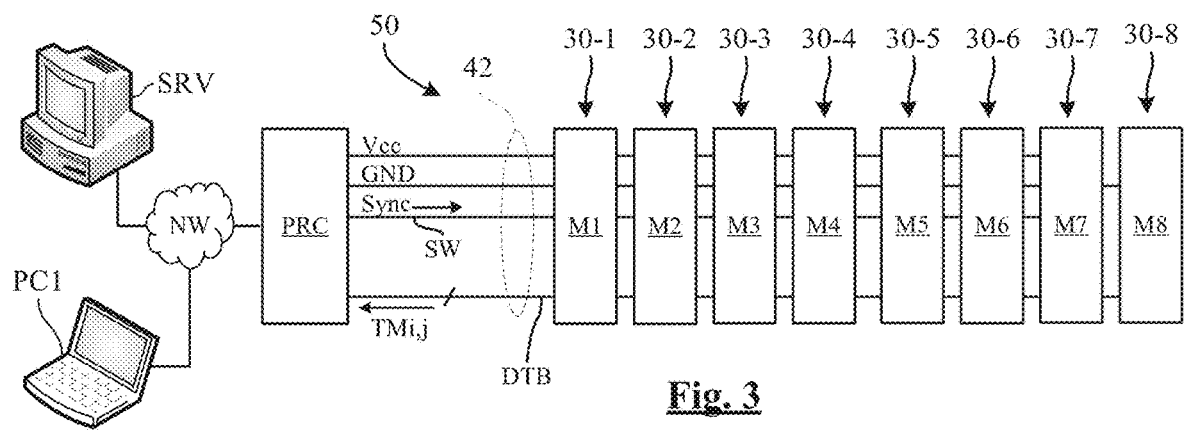
FIG. 3 is an electrical diagram of a control device comprising such control modules.

FIG. 3 is a block diagram of the electrical architecture of the device 50, showing other elements thereof. There are eight control modules 30-$i$ (30-1 to 30-8) each fitted with a magnetometer $M_i$ (M1 to M8), the magnetometers being interconnected by the data and power bus 42. The bus 42 includes a data bus DTB including a clock wire, a synchronization wire SW, and power supply wires GND and Vcc. The synchronization wire SW allows a synchronization signal to be applied to the magnetometers, to trigger simultaneous measurements of the temperatures $TM_{i,j}$ of the magnetometers $M_i$ at times $T_j$.

Each magnetometer $M_i$ is connected via the bus 42 to a processor PRC, for example a microcontroller. The processor PRC may be housed in one of the control modules 30-$i$, which then forms both a control module and a master module controlling the other modules. Alternatively, a specific control module equipped with the processor PRC may be provided. The control module is arranged at any location of the electrical panel and is connected to the modules $M_i$ through the left connector 431 of the first module 30-1 or the right connector of the last module 30-8. The processor PRC supplies the synchronization signal Sync to the magnetometers $M_i$ and receives from them, at successive times $T_j$ defined by the Sync signal, for example every 3 seconds, the temperatures measured by the temperature sensors of the magnetometers. These temperatures, which are those of the silicon chips of the magnetometers, will be noted $TM_{i,j}$ where "i" is the rank of a magnetometer and "j" the rank of a temperature measurement on a temporal scale defined by the Sync signal.

The device 50 also optionally includes a server SRV to which the processor PRC is connected via a network NW, such as the Internet. The temperatures $TM_{i,j}$ collected by the processor PRC are processed through an algorithm for monitoring the operating status of each circuit breaker. This algorithm is executed by either the processor PRC or the server SRV, or partly by the processor PRC and partly by the server. If the implementation conditions do not allow a reliable connection with the server, the execution of the algorithm by the processor PRC may be preferred. The server SRV may also be configured to manage subscriber accounts to which users connect via the Internet with personal computers PC1, to access information on the operating status of the circuit breakers in their electrical network.

In what follows, it will be considered for the sake of simplicity of the description that the entire control algorithm is executed by the server SRV, the processor only ensuring tasks of synchronization of the modules 30-1, collection of the temperatures $TM_{i,j}$ and transmission thereof to the server.

Figure 4:
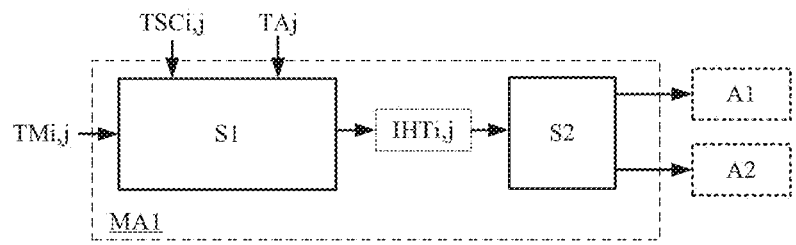
FIG. 4 illustrates a circuit breaker control algorithm implemented by the device of FIG. 3.

According to an embodiment MA1 of the algorithm schematized in FIG. 4, the temperatures $TM_{i,j}$ are analyzed by the server SRV to detect an abnormal heating of at least one of the circuit breakers. The algorithm MA1 includes an analysis phase S1 and a decision phase S2. The analysis phase S1 consists in estimating the internal heating temperatures of the circuit breakers $IHT_{i,j}$. These temperatures $IHT_{i,j}$ are estimated from the temperatures $TM_{i,j}$ measured by the magnetometers and from a value of the ambient temperature.

The decision phase S2 aims at deciding, from the internal heating temperatures $IHT_{i,j}$ of the circuit breakers, if alarms should be issued. In one embodiment, the server issues an alarm A1 of a first type when the internal heating temperature of a circuit breaker reaches the first temperature threshold TT1 and issues an alarm A2 of a second type when the internal heating temperature of a circuit breaker reaches a temperature threshold TT2 higher than the temperature threshold TT1. Alarm A1 is issued, for example, when the internal heating temperature of the circuit breaker is such that a technical intervention is recommended. Alarm A2 is issued, for example, when it is estimated that a circuit breaker requires urgent intervention.

This emission of one or more alarms is based on the knowledge that an increase in the internal heating temperature of a circuit breaker, even if it is not excessively high, may be indicative of a failure and/or may herald a more serious failure. To select the thresholds for alarms A1, A2, refer to table 1 below, which describes several possible situations.

TABLE 1

| Internal heating temperature of a circuit breaker | Recommended action |
| --- | --- |
| 1° C.-10° C. | Possible failure, justifies investigation |
| 11° C.-20° C. | Possible failure, repair or investigation recommended when planning permits |
| 21° C.-40° C. | Place the component under surveillance until corrective action can be taken |
| >40° C. | Major failure, immediate repair required |

For the implementation of the algorithm MA1, the temperature threshold TT1 for the issue of the alarm A1 is chosen according to the requirements of the application, and could be for example between 11° C. and 40° C., this value representing a deviation from the ambient temperature. The threshold TT2 for the emission of the alarm A2 will be, for example, 40° C., meaning that a circuit breaker is at risk of burning, this value also representing a deviation from the ambient temperature. The values of the temperature thresholds TT1, TT2 may be modulated according to the environment, the danger of the site (presence of inflammable gases for example), etc.

The issue of an alarm, depending on the degree of alert to which it corresponds, may consist of one or more of the following actions: displaying information on a control screen connected to the device, displaying information on the home page of the user's account, sending an electronic message to the user or to a remote monitoring center (email, SMS, etc.), activating an indicator light, triggering an audible alarm, etc.

For the implementation of the algorithm MA1, it is considered that the temperature $TM_{i,j}$ measured by each magnetometer $M_i$ of rank i at each time $T_j$ is a function of:
  the internal heating temperature $TSC_{i,j}$ of the magnetometer semiconductor chip at time $T_j$ related to the activity of the magnetometer,
  the ambient temperature $TA_j$ at time $T_j$ (air temperature), which will be considered as common to all magnetometers, and
  the internal heating temperature $IHT_{i,j}$ of the circuit breaker with which the magnetometer $M_i$ is associated.

The temperature $TM_{i,j}$ is thus equal to the weighted sum of these three temperatures and can be written as follows:

$$TM_{i,j}=a_i*TSC_{i,j}+b_i*TA_j+c_i*IHT_{i,j} \quad (1)$$

$a_i$, $b_i$, $c_i$ being weighting coefficients constant with time, representative of the influence of each heat source on the temperature $TM_{i,j}$ of the magnetometer semiconductor wafer.

The analysis phase S1 as implemented in one embodiment of the invention is based on a simplifying assumption regarding the internal heating temperature $TSC_{i,j}$ of the magnetometer and on a simplifying evaluation of the ambient temperature $TA_j$.

Assumption on Temperature $TSC_{i,j}$:

It is observed that the internal heating temperature $TSC_{i,j}$ of the magnetometer semiconductor chip, related to the operation of the internal circuits and the internal resistances of the silicon conductors, is generally constant. In addition, their power consumption is very low and their internal heating, generally of the order of one or two degrees, may be considered negligible compared to the heat sources represented by the ambient temperature and the heating of the circuit breaker. Thus, the variations of the measured temperature $TM_{i,j}$ are independent of the internal heating temperature $TSC_{i,j}$ of the semiconductor. The temperature $TSC_{i,j}$ has no significant effect on the variations of the measured temperature $TM_{i,j}$ and equation (1) can be simplified as follows, by removing the TSC component$_{i,j}$:

$$TM_{i,j}=b_i*TA_j+c_i*TD_{i,j} \quad (2)$$

Evaluation of the Ambient Temperature $TA_j$:

In one embodiment, the ambient temperature $TA_3$ may be measured by means of a dedicated temperature sensor placed in or near the electrical panel. However, it is observed that the ambient temperature varies very slowly compared to the temperature of the circuit breakers, which is a function of the current flowing through them and any faults that may occur. The ambient temperature can therefore, over a short period of time, of the order of a few minutes to a few hundred minutes, be considered constant. Thus, in an embodiment of the analysis phase S1 that does not require measuring the ambient temperature by means of a dedicated sensor, the ambient temperature at a time $T_j$ of rank "j" is estimated from the temperatures $TM_{1,j}$, $TM_{2,j}$, $TM_{3,j}$, $TM_{4,j}$, $TM_{5,j}$, $TM_{6,j}$, $TM_{7,j}$, $TM_{8,j}$, measured by the magnetometers.

The ambient temperature $TA_j$ can be estimated using one of the following methods, where $ETA_j$ is the estimated ambient temperature.

First Method:

$$ETA_j=[TM_{1,j}+TM_{2,j}+TM_{3,j}+TM_{4,j}+TM_{5,j}+TM_{6,j}+TM_{7,j}+TM_{8,j}]/8 \quad (3)$$

In this case, the estimated ambient temperature $ETA_j$ is equal to the average of the temperatures measured by the magnetometers $M_i$.

Second Method:

$$ETA_j=[k1*TM_{1,j}+k2*TM_{2,j}+k3*TM_{3,j}+k4*TM_{4,j}+\\k5*TM_{5,j}+k6*TM_{6,j}+k7*TM_{7,j}+k8*TM_{8,j}]/[k1+k2+\\k3+k4+k5+k6+k7+k8] \quad (4)$$

In this case, the estimated ambient temperature $ETA_j$ is equal to the weighted average of the temperatures measured by the magnetometers $M_i$, k1 to k8 being weighting coefficients. For example, weighting coefficients k1 and k8 greater than 1 may be chosen for the magnetometers placed at the beginning and end of the row of control modules, and weighting coefficients k2 to k7 may be equal to 1 for the other modules.

Third Method:

$$ETA_j=\text{LOWER\_VALUE}\{TM_{1,j},TM_{2,j},TM_{3,j},TM_{4,j},\\TM_{5,j},TM_{6,j},TM_{7,j},TM_{8,j}\} \quad (5)$$

In this case, the estimated ambient temperature $ETA_j$ is equal to the lowest value ("LOWER_VALUE") of all temperatures measured by the magnetometers.

Fourth Method:

The estimated ambient temperature $ETA_j$ may also be calculated by a combination of the values obtained according to two or three of the above methods, and be for example equal to the average temperature value obtained by formula (3) or (4) and that obtained by formula (5). Other methods may be carried out by the skilled person, alone or in combination with any of the above methods, for example predictive methods based on the observation of the previous ambient temperatures, considering the time, day and month of the year, the weather forecast for the current day, etc.

Figure 5:
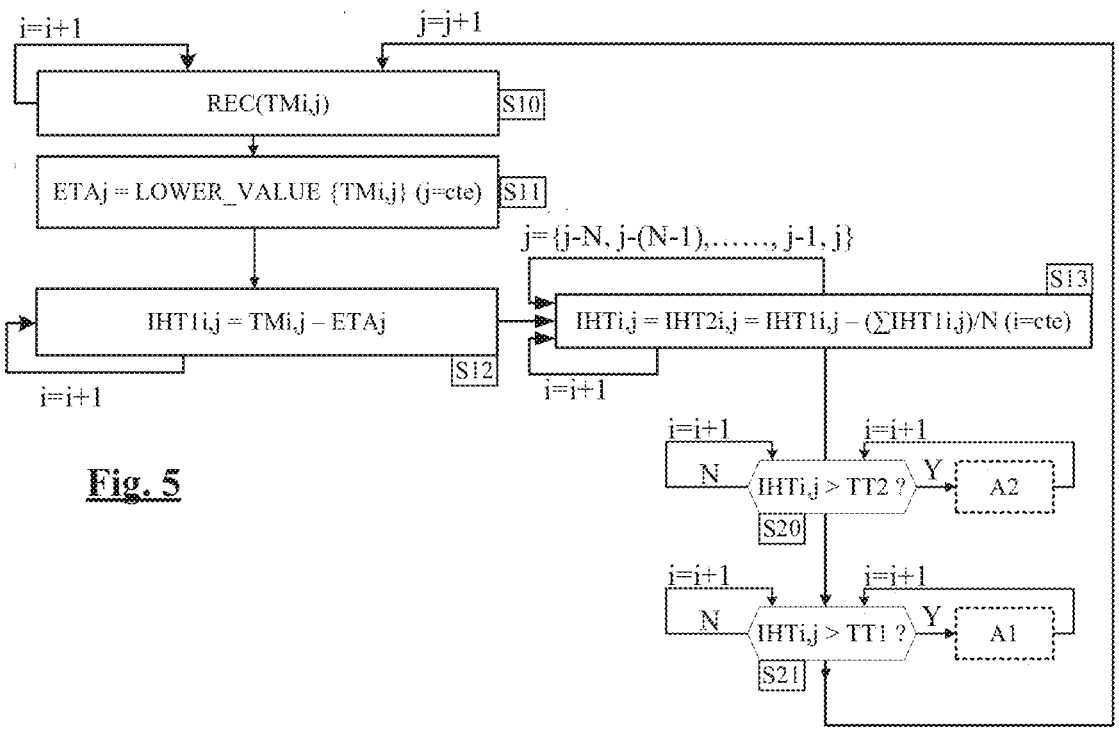
FIG. 5 is a flowchart showing computational steps of the circuit breaker control algorithm of FIG. 4.

FIG. 5 shows an example of how the analysis phase S1 and the decision phase S2 implementing the simplifying assumption and evaluation just described. The analysis phase includes steps S10, S11, S12 and S13. The step S10 noted "REC($TM_{i,j}$)" on FIG. 5, is a step of collection and recording ("REC") of the temperatures $TM_{i,j}$ measured by the magnetometers $M_i$ at different times $T_j$. This is a background task that aims at recording a very large number of temperatures according to a sliding reference time window Tref of several hours duration, preferably several tens of hours, for example 24 hours. If the times $T_j$ are separated by a time interval of 3 seconds, the server SRV collects, in 24 hours, for each magnetometer, 24*3600/3 temperatures $TM_{i,j}$, i.e., 40 800 temperature values, to be multiplied by the number of magnetometers.

During step S11, the server calculates the estimated ambient temperature $ETA_j$ at a time $T_j$ according to one of the methods described above. The method shown on FIG. 5 is the one consisting in retaining the lowest of the temperatures measured by the magnetometers as representative of the ambient temperature (formula (5)).

During step S12, the server subtracts the estimated ambient temperature $ETA_j$ from the value of each of the temperatures $TM_{i,j}$ measured by the magnetometers at the same time $T_j$, to obtain a first estimate $IHT1_{i,j}$ of the internal heating temperature of each circuit breaker:

$$IHT1_{i,j}=TM_{i,j}-ETA_j \quad (6)$$

This calculation is performed for each magnetometer of rank i, i.e., here for obtaining 8 first estimates $IHT1_{i,j}$. Step S12 is repeated for each new time $T_{j+1}$, recalculating each time a new value $TA_{j+1}$ of the evaluated ambient temperature, to obtain 8 new estimates $IHT1_{i,j+1}$.

It will be noted that the expression "measured at the same time" means here "sampled at the same time $T_j$", the temperatures $TM_{i,j}$ measured by the magnetometers being sampled at each of the times $T_j$ defined by the synchronization signal Sync. In practice, the moments the temperatures $TM_{i,j}$ are supplied on the data bus are not exactly the same, the temperatures being received one after the other.

The next step S13 is optional and is based on the observation that the temperatures $TM_{i,j}$ have a variable error, or offset, from the actual temperature of the magnetometers. Thus, two magnetometers brought to the same temperature do not necessarily measure the same temperatures. In practice, this offset can reach a few degrees. To correct this error, the server, for each magnetometer $M_i$, calculates the average value of all the first estimates $IHT1_{i,j}$ calculated in relation to the time $T_j$ and the N previous times $T_{j-N}, T_{j-(N-1)}, \ldots T_{j-1}$ included in the sliding time window Tref, that is $(\Sigma IHT1_{i,j})/N$. The server then subtracts this average value from the first estimate $IHT1_{i,j}$ to obtain a second estimate $IHT2_{i,j}$ of the internal heating temperature whose value is thus the following:

$$IHT2_{i,j}=IHT1_{i,j}-(\Sigma IHT1_{i,j})/N \text{ with } i \text{ constant and}\\j=j-N, j-(N-1), \ldots j-1, j \quad (7)$$

The number N of estimated temperatures $IHT1_{i,j}$ used for this calculation may be very high and is, at most, equal to the number of temperatures $TM_{i,j}$ that have been calculated and stored in the sliding time window Tref.

The second estimate $IHT2_{i,j}$ of the internal heating temperature of each circuit breaker $D_i$ is then, for the implementation of the decision phase S2, considered as the internal heating temperature $IHT_{i,j}$ of the circuit breaker $D_i$, that is:

$$IHT_{i,j}=IHT2_{i,j} \quad (8)$$

Step S13 is, like step S12, repeated as many times as there are magnetometers in the device according to the invention.

In an alternative where step S13 is not implemented, the first estimate $IHT_{i,j}$ of the estimated internal heating temperature is considered to be the internal heating temperature $IHT_{i,j}$ of the circuit breaker $D_i$ for the implementation of the decision phase S2.

The estimates $IHT_{i,j}$ obtained at the end of phase S1 including step S13 are therefore free of ambient temperature variations, and the calculation carried out in step S13 has the effect of centering them around 0° C. Their excursion above 0° C. is representative of the internal heating of each circuit breaker, i.e., its temperature variation with respect to the ambient temperature.

The decision phase S2 includes steps S20, S21. During step S20, the server determines whether the internal heating temperature $IHT_{i,j}$ of each circuit breaker $D_i$ is higher than the temperature threshold TT2, which thus represents a variation of the circuit breaker temperature and not its actual temperature. If the answer is positive ("Y"), the server issues the alarm A2 for the concerned circuit breaker, then repeats the step S20 for the next circuit breaker. If the response is negative ("N"), the server does not issue the alarm A2 and repeats step S20 for the next circuit breaker. When the internal heating temperatures have been checked for each circuit breaker, the server executes step S21, except in the exceptional case where each circuit breaker has a temperature higher than TT2 (not shown).

During step S21, the server determines, for each temperature $IHT_{i,j}$ which was not found to be higher than threshold TT2 in step S20, whether this temperature is higher than threshold TT1. The server issues alarm A1 for the concerned circuit breaker if the answer is positive ("Y"), then repeats step S21 for the next circuit breaker, unless the temperature of the next circuit breaker was found to be higher than threshold TT2 in step S20.

When all the internal heating temperatures have been checked, the server returns to step S10 if the phases S1 and S2 are executed sequentially. However, phases S1 and S2 can also be executed simultaneously, for example phase S1 may be executed in relation to temperatures measured at a time $T_j$ while phase S2 may be executed in relation to temperatures measured at a time $T_{j-1}$ preceding the time $T_j$. The phases S1 and S2, whether simultaneous or sequential, may be executed in the period of time that separates two times $T_j$, for example 3 seconds, this period being very large on the scale of the computing time of the server and largely sufficient to also update the information on the user's profile and to issue alarms A1, A2 if necessary. Phases S1 and S2 may also be executed off-line, but preferably without waiting for a long period of time to elapse, for reasons of security of the installation under surveillance.

Figure 6:
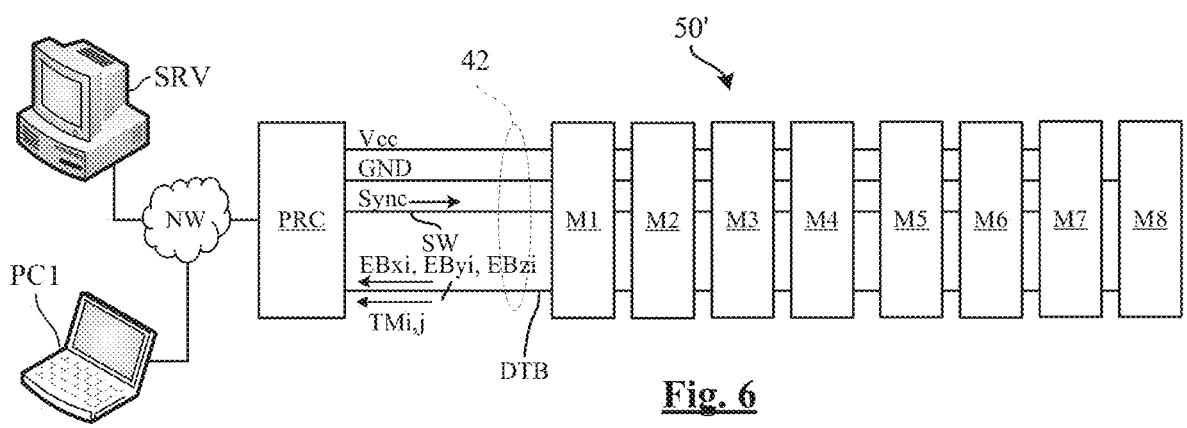
FIG. 6 is an electrical diagram of an alternative of the control device of FIG. 3.

FIG. 6 is a block diagram of an alternative 50' of the device 50 of FIG. 3. The structure of device 50' is identical to that of device 50. The device 50' differs from the device 50 in that the processor PRC receives from the magnetometers $M_i$, at each of the successive times $T_j$ defined by the signal Sync, in addition to the temperatures $TM_{i,j}$, the sampled value $EBx_i$, $EBy_i$, $EBz_i$ of at least one of the magnetic field components $Bx_i$, $By_i$, $Bz_i$ measured by each magnetometer $M_i$. According to a method described in EP2637027, the processor PRC or the server SRV deduces from this the current $I_{i,j}$ that flows, at time $T_j$, through each circuit breaker $D_i$.

Figure 7:
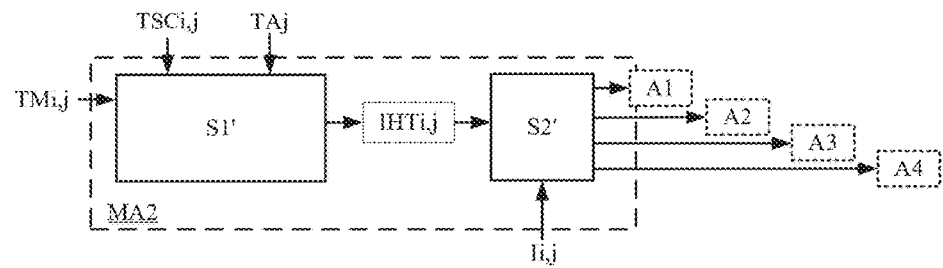
FIG. 7 illustrates a circuit breaker control algorithm implemented by the device of FIG. 6.

FIG. 7 represents an embodiment MA2 of the control algorithm according to the invention implemented by the device 50' and taking into account the measurement of currents flowing through the circuit breakers. The algorithm comprises an analysis phase S1' and a decision phase S2'. The decision phase S2' takes into account, in addition to the internal heating temperatures $IHT_{i,j}$ of the circuit breakers, the currents $I_{i,j}$ flowing through the circuit breakers. The decision phase S2' provides, in addition to the alarms A1 and A2, an alarm of a third type A3 and an alarm of a fourth type A4.

Alarm A3 is an alarm related to the operating rates of circuit breakers, which is a function of the time during which a circuit breaker withstands a current, or conduction periods, during an observation period. This observation period is a sliding time window of duration Tobs, set at each time $T_j$. The window Tobs is, for example, equal to a few hours or a few days depending on the type of equipment powered by the circuit breaker. Alarm A3 is issued when the rate of operation of a circuit breaker increases very significantly during the observation period. Alarm A4 is issued when the server observes a correlation between a noticeable increase in the operating rate and an increase in the temperature of the circuit breaker. Alarm A4 is issued instead of alarms A1 and A3, for example, when the conditions for issuing alarms A1 and A3 are met.

Figure 8:
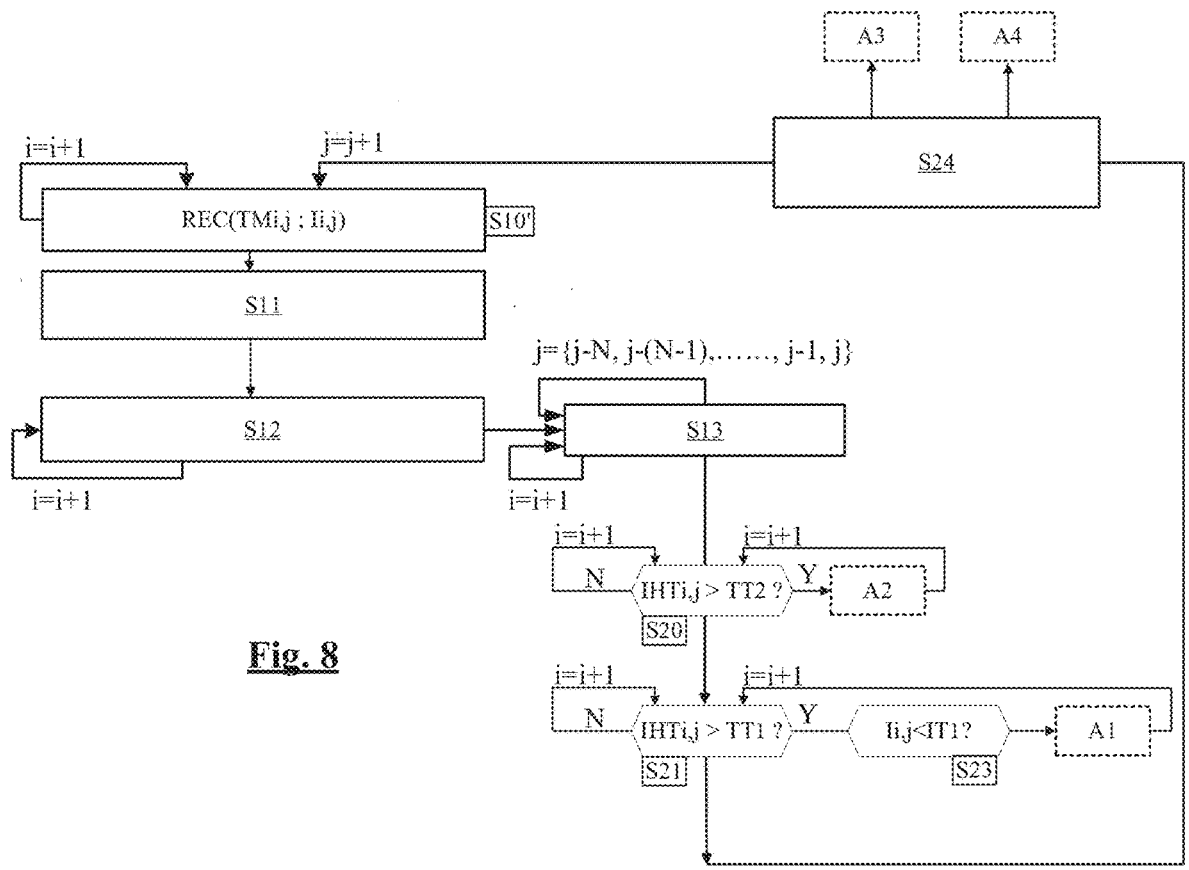
FIG. 8 is a flowchart showing computational steps of the control algorithm of FIG. 7.

FIG. 8 shows an example of implementation of the analysis phase S1' and of the decision phase S2'. The analysis phase S1' is identical to the previously described phase S1 except that step S10 is replaced by a phase S10' of collecting and recording ("REC"), at each time $T_j$, the temperatures $TM_{i,j}$ measured by the magnetometers $M_i$ and the currents $I_{i,j}$ estimated from the magnetic field measurements. As before, this is a background task which aims to record a very large number of temperatures and current values in the above-mentioned sliding time window Tref, for example 24 hours. The analysis phase further comprises the previously described steps S11, S12 and S13, which are unchanged.

Phase S2' includes the previously described steps S20 and S21, and additional steps S23 and S24. Step S23 is executed after step S21, before issuing the alarm A1, when the result of the comparison with the temperature threshold TT1 is positive. During step S23, the server determines whether or not the current $I_{i,j}$ flowing through the circuit breaker concerned is less than a current threshold IT1. The alarm A1 is issued only if the current is lower than this threshold IT1. In other words, a temperature higher than TT1 is only considered abnormal if the circuit breaker is traversed by a current for which such a temperature should not be observed.

Step S24 is a high-level decision and analysis step aimed in particular at issuing alarms A3 and A4, and may be implemented by means of complex algorithms that may use artificial intelligence methods. Step S24 aims to correlate the rate of operation of the circuit breakers, the internal heating temperatures of the circuit breakers and the currents observed in the circuit breakers. A histogram of the conduction periods of each circuit breaker may also be taken into account, before making the decision to issue alarm A3 and/or A4.

In particular, in one embodiment, when the internal heating temperatures of two contiguous circuit breakers $D_i$, $D_{i+1}$ each reaches the first temperature threshold TT1, the server may decide not to issue the alarm A1 for the circuit breaker $D_i$ if no current has passed through it for a given time.

For example, to issue the alarm A3, the server may calculate the operating rate of each circuit breaker in the observation period Tobs, taking into account the number of conduction periods and the duration of each of these periods, and monitor the variation of the operating rate of the circuit breaker within the observation period. Alarm A3 is issued if the change in the operating rate of the circuit breaker under consideration exceeds a specified change threshold TXF. The alarm A3 is issued, for example, based on an analysis of the circuit breaker operating rate histogram, i.e., the frequency and duration of the circuit breaker conduction periods in the observation period Tobs. For example, the server classifies the conduction periods into classes of different durations, such as 10 minutes, 1 hour, 3 hours and 24 hours. An anomaly justifying the emission of alarm A3 is noted when the histogram shows a strong variation in the classification of the conduction periods in these various classes, accompanied by an overall increase in the operating rate over the observation period. For example, a piece of equipment such as a refrigeration system, which normally presents 30-minute operating cycles, corresponding to a current flow in the circuit breaker, interspersed with 15-minute shutdown cycles, will be considered as potentially faulty if it suddenly presents, for example over the last 24 hours, 2-hour operating cycles interspersed with 5-minute shutdown cycles. If at the same time the conditions are met for the emission of alarm A1, meaning here that two anomalies occur at the same time, alarm A4 will be emitted instead of alarms A1 and A3.

It can also happen that the temperature increase of a circuit breaker $D_i$ is not due to the current flowing through it or to a malfunction, but to the heating of an adjacent circuit breaker, e.g., circuit breaker $D_{i+1}$, which is communicated to circuit breaker $D_i$ by thermal conductivity. Thus, what has been considered so far as the "internal heating temperature" of a circuit breaker is only an assumed internal heating temperature, i.e., a temperature that is assumed to be related to an internal heating of the circuit breaker. In reality, this temperature may be due, in whole or in part, to that of an adjacent circuit breaker. For reasons of language simplification, however, the term "internal heating temperature" of a circuit breaker is retained throughout the description and claims as representative of a heating of the circuit breaker independent of the ambient temperature and caused by the operating state of the circuit breaker including possibly the operating state of adjacent circuit breakers.

When the increase in the internal heating temperature of a circuit breaker $D_i$ is due in whole or in part to the heating of an adjacent circuit breaker, the emission of the alarm A1 for this circuit breaker may be inhibited by the server. Thus, when the conditions for issuing the alarm A1 are met for two adjacent circuit breakers, the server compares the operating rates of each circuit breaker to identify the circuit breaker with the highest probability of abnormality of its operating state, and issues the alarm A1 only for the circuit breaker with the highest probability of abnormality of its operating state.

It will be clear to the person skilled in the art that the algorithm just described is susceptible to various alternatives and embodiments. In particular, although it has been proposed in the above to estimate the internal heating temperatures $IHT_{i,j}$ including a recentering of these temperatures around zero (step S13), the phase S1 may be designed to calculate and provide only the relative variations of the internal heating temperatures of the circuit breakers, without a recentering. The phase S2 may also be based on the analysis of these variations by means of an artificial intelligence classifier algorithm, possibly including a learning phase and/or a phase of calibration of the temperatures when the circuit breakers are put into service.

Also, in an alternative embodiment of the method just described, step S12 is omitted. The server does not calculate an estimate of the internal heating temperature $IHT_{i,j}$ of the circuit breakers during phase S1 and may only optionally recenter the values of the temperatures $TM_{i,j}$ measured by the magnetometers by dividing them by their average value calculated over N times $T_j$, applying step S13 to the temperatures $TM_{i,j}$ instead of applying it to the estimates $IHT_{i,j}$. In this case, during steps S20 and S21 of phase S2, the server compares the temperatures $TM_{i,j}$ to variable temperature thresholds $TT1_j$ and $TT2_j$ which are corrected at each time $T_j$ according to the current ambient temperature $TA_j$ for example as follows:

$$TT1_j = TT1 + TA_j \quad (9)$$

$$TT2_j = TT2 + TA_j \quad (10)$$

It will be observed that this alternative is, in substance, equivalent to the previously described embodiment, in that the tests of steps S20, S21, i.e.:

$$IHT_{i,j} > TT1 \quad (11)$$

$$IHT_{i,j} > TT2 \quad (12)$$

may also be written:

$$IHT_{i,j} = TM_{i,j} - TA_j > TT1 \quad (13)$$

$$IHT_{i,j} = TM_{i,j} - TA_j > TT2 \quad (14)$$

or:

$$TM_{i,j} > TT1 + TA_j \quad (15)$$

$$TM_{i,j} > TT2 + TA_j \quad (16)$$

In other words, to determine, from the temperatures $TM_{i,j}$ measured by the magnetometers and the ambient temperature, whether the internal heating temperature $IHT_{i,j}$ of a circuit breaker reaches a temperature threshold, it is also possible to compare the temperatures $TM_{i,j}$ measured by the magnetometers with a threshold that is modulated according to the ambient temperature $TA_j$.

It will also be apparent to the person skilled in the art that the above-described method of analyzing the operation of circuit breakers may be implemented without current measurement, by replacing the magnetometers with integrated current sensors on semiconductor chips.

We will now recall the general features of the method described in EP2637027, allowing to measure the current flowing through a circuit breaker $D_i$ by means of the associated triaxial magnetometer $M_i$.

Figure 9:
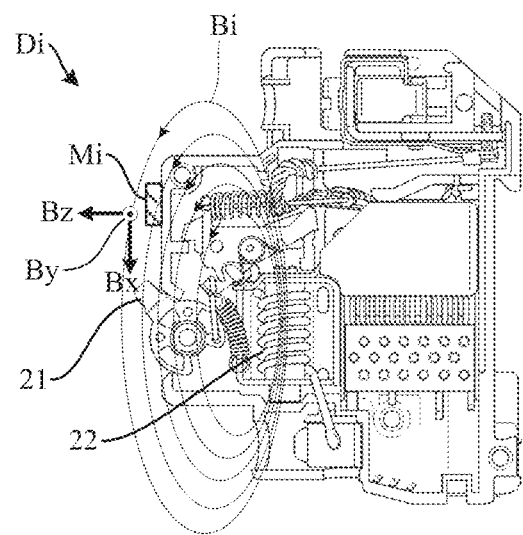
FIG. 9 shows a circuit breaker and the components of a magnetic field emitted by the protection coil of the circuit breaker.

FIG. 9 is a cross-sectional view of a circuit breaker $D_i$. The reset lever 21 and the protection coil 22 of the circuit breaker can be seen, as well as the magnetometer $M_i$ attached to one side of the circuit breaker. The three components Bx, By, Bz of the magnetic field emitted by the protection coil, measurable by means of the magnetometer $M_i$ are also shown.

As shown in FIG. 6, the processor PRC provides the synchronization signal Sync and receives, in addition to the temperature $TM_{i,j}$, at least one of the sampled components $EBx_i$, $EBy_i$, $EBz_i$ of the magnetic field emitted by each circuit breaker, as measured by the triaxial magnetometer $M_i$ associated with it.

The component received and considered for measuring the currents flowing through the circuit breakers is the one that, according to the structure of the circuit breakers, is the most representative of these currents. The processor PRC may also receive and process samples $EBx_i$, $EBy_i$, of the components $Bx_i$, $By_i$, if greater measurement accuracy is desired.

The following steps are described as being performed by the processor PRC but could also be performed by the server, the latter then receiving all or part of the samples $EBx_i$, $EBy_i$, $EBz_i$, of the components $Bx_i$, $By_i$, $Bz_i$.

The processor PRC (or server) applies a processing step to the samples $EBz_i$, or to the samples $EBx_i$, $EBy_i$, $EBz_i$, to remove a DC component due to the Earth's magnetic field and calculate their RMS value. The removal of the DC component is done by calculating the average value of all samples over N samples and subtracting this average value from the value of each sample. The RMS value of the components is then determined by the processor PRC by calculating the square root of the sum of the squared samples divided by the number N1 of samples, according to the conventional formula $\sqrt{(1/N1)(\Sigma EBzi)}$. Simplifying algorithms known per se can be used to perform this RMS value calculation while saving computing resources or memory.

In what follows, "$Bx_i$", "$By_i$", "$Bz_i$" designate the RMS values of the components bearing the same reference, calculated as previously indicated. The term "component" designates this RMS value, calculated at a given moment from several samples. This RMS value is recalculated regularly, to obtain several values of the component and to follow its evolution in time for the implementation of the steps described hereafter.

The processor PRC applies a processing step to the component $Bz_i$ calculated in this way, or to the components $Bx_i$, $By_i$, $Bz_i$ calculated in this way, in order to neutralize the effects of a magnetic interference phenomenon between circuit breakers. This processing step makes it possible to obtain corrected components $CBz_i$, or groups of corrected components $CBx_i$, $CBy_i$, $CBz_i$.

The processor PRC is also configured to transform each corrected component $CBz_i$, or each group of corrected components $CBx_i$, $CBy_i$, $CBz_i$, into a value of current flowing in the circuit breaker $D_i$ associated with the considered magnetometer $M_i$, that is to say, the value of the current flowing in the branch of the electrical network that the circuit breaker protects.

The transformation of a corrected component $CBz_i$ into a current value is carried out by means of conversion parameters stored by the processor PRC, determined during a calibration phase. This calibration phase includes, for example, for each circuit breaker:
- a step of opening all the circuit breakers except the one to be calibrated, which is left in the on state,
- a step of measuring the current in the electrical line protected by the circuit breaker, by any conventional means, or of estimating this current by connecting the line to an electrical load whose consumption is known,
- a step of measuring the component $Bz_i$ of the corresponding magnetic field, by means of the corresponding magnetometer $M_i$, and
- a step of memorizing the measured current I and the component $Bz_i$, or the ratio $I/Bz_i$ between the measured current and the component $Bz_i$.

These calibration steps may be repeated with multiple current values for greater accuracy. If the processor PRC uses both components $Bx_i$, $By_i$ to measure the current, a similar calibration step is applied to them. The processor PRC then obtains three current values from each component, and averages these values to determine the current value, or calculates the modulus of the magnetic field vector associated with these three components to derive the current value.

Neutralization of the magnetic interference effect, if necessary, may be performed as follows. For the sake of simplicity, only the interference suppression in the component $Bz_i$ will be considered, the following being applicable to the other two components.

Figure 10:
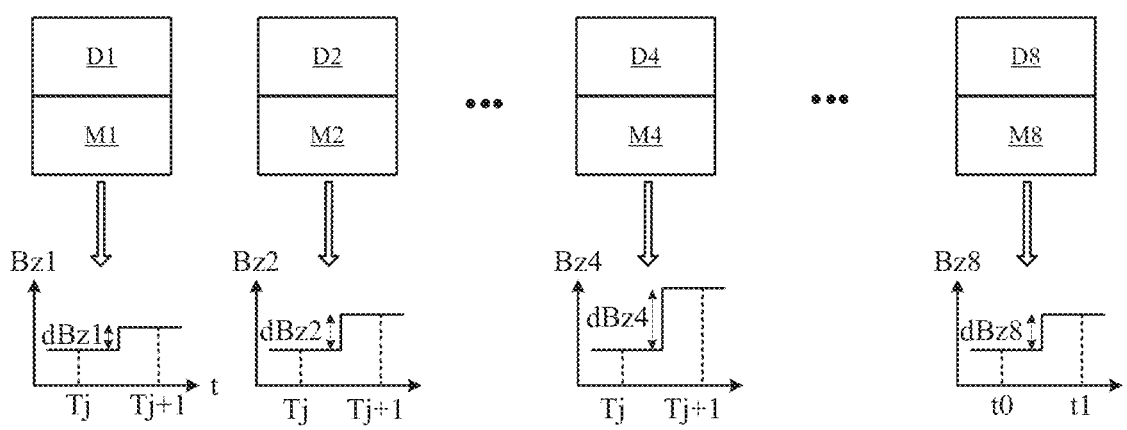
FIG. 10 illustrates a step in a process for correcting magnetic interference between circuit breakers.

As illustrated schematically in FIG. 10, consider as an example the row of circuit breakers $D_i$ (D1 to D8) of device 50, each equipped with a magnetometer $M_i$ (M1 to M8). Each circuit breaker $D_i$ creates a magnetic field which is governed by Biot and Savard's law and extends over a certain distance, with a decay in 1/d in the 3 detection directions, "d" being the distance relative to the circuit breaker coil. At a given time $T_j$, upon reception of the synchronization signal Sync sent by the processor PRC, each magnetometer $M_i$ provides the component $Bz_i$ of the magnetic field emitted by the corresponding circuit breaker $D_i$. This component $Bz_i$ is tainted by an error caused by the addition of the magnetic fields emitted by the neighboring circuit breakers, if they have current flowing through them, and is therefore no longer proportional to the current flowing in the circuit breaker $D_i$.

Those skilled in the art can define methods or algorithms allowing to subtract from the component $Bz_i$ the effects of the interference. For example, one method involves a calibration before the device is put into service: for each circuit breaker $D_i$, the interference produced by the circuit breaker $D_i$ on all the neighboring circuit breakers is systematically measured for a whole range of current values. A database is thus formed which is supplied to the processor PRC and used by the latter to correct the components $Bz_i$ supplied by the magnetometers $M_i$.

Optionally, the processor PRC performs a learning interference suppression process that does not require calibration. This process includes a learning phase and an operation phase.

Learning phase:
i) the processor PRC measures the components $Bz_i$ (Bz1 to Bz8) at two times $T_j$ and $T_{j+1}$, and calculates the variation $dBz_i = Bz_i(T_{j+1}) - Bz_i(T_j)$ of each component $Bz_i$.

ii) the processor PRC looks for the highest variation $dBz_i$ in absolute value. This is for instance dBz4 in the example shown in FIG. 10.

iii) the processor PRC attributes the origin of the variation of each component $Bz_i$ to a variation of current in the circuit breaker which presents the strongest variation of its magnetic field, here the circuit breaker D4, and thus assumes that the current has not varied in the other circuit breakers (this step is implicit and underlies step iv below).

iv) the processor PRC calculates, for circuit breaker D4, an interference parameter $P_{i,4}$ which represents the influence of circuit breaker D4 on the magnetometers $M_i$ associated with the other circuit breakers, with:

$$P_{i,4} = dBzi/dBz4$$

For the magnetometer M4, this parameter is therefore equal to 1.

v) the processor PRC repeats steps i to iv as the currents in the various circuit breakers vary, until it obtains an interference parameter $P_{i,j}$ from each circuit breaker of rank j on each magnetometer of rank i, i.e.:

$$P_{i,j} = dBzi/dBzj$$

for i ranging from 1 to 8 and j ranging from 1 to 8. Each calculation is as before based on the detection of the largest measured variation dBz in absolute value. Each interference parameter $P_{i,j}$ may be calculated several times and then averaged, to obtain a more accurate value.

vi) At the end of the learning step, the processor PRC obtains a set of interference vectors $VINT_j$. Each interference vector $VINT_j$ is associated with a circuit breaker $D_j$ and includes the interference parameters of this circuit breaker on the magnetometers associated with the other circuit breakers. For example, for circuit breaker D4, the interference vector VINT4 is equal to:

$$VINT4 = \{dBz1/dBz4, dBz2/dBz4, dBz3/dBz4, 1, dBz5/dBz4, dBz6/dBz4, dBz7/dBz4, dBz8/dBz4\}$$

Or:

$$VINT4 = \{P1,4, P2,4, P3,4, 1, P5,4, P6,4, P7,4, P8,4\}$$

The processor PRC then defines an interference matrix "MINT" shown below, by associating to each column of the matrix an interference vector $VINT_j$. The vector VINT1 forms the first column of the matrix, the vector VINT2 the second column, and so on.

MINT Matrix

TABLE 2

| 1 | dBz1/dBz2 | dBz1/dBz3 | dBz1/dBz4 | dBz1/dBz5 | dBz1/dBz6 | dBz1/dBz7 | dBz1/dBz8 |
|---|---|---|---|---|---|---|---|
| dBz2/dBz1 | 1 | dBz2/dBz3 | dBz2/dBz4 | dBz2/dBz5 | dBz2/dBz6 | dBz2/dBz7 | dBz2/dBz8 |
| dBz3/dBz1 | dBz3/dBz2 | 1 | dBz3/dBz4 | dBz3/dBz5 | dBz3/dBz6 | dBz3/dBz7 | dBz3/dBz8 |

TABLE 2-continued

| dBz4/dBz1 | dBz4/dBz2 | dBz4/dBz3 | 1 | dBz4/dBz5 | dBz4/dBz6 | dBz4/dBz7 | dBz4/dBz8 |
|---|---|---|---|---|---|---|---|
| dBz5/dBz1 | dBz5/dBz2 | dBz5/dBz3 | dBz5/dBz4 | 1 | dBz5/dBz6 | dBz5/dBz7 | dBz5/dBz8 |
| dBz6/dBz1 | dBz6/dBz2 | dBz6/dBz3 | dBz6/dBz4 | dBz6/dBz5 | 1 | dBz6/dBz7 | dBz6/dBz8 |
| dBz7/dBz1 | dBz7/dBz2 | dBz7/dBz3 | dBz7/dBz4 | dBz7/dBz5 | dBz7/dBz6 | 1 | dBz7/dBz8 |
| dBz8/dBz1 | dBz8/dBz2 | dBz8/dBz3 | dBz8/dBz4 | dBz8/dBz5 | dBz8/dBz6 | dBz8/dBz7 | 1 |

The MINT matrix obtained during the learning phase may be imperfect. Therefore, learning may continue during the operation phase, to refine the interference parameters. Thus, the learning phase may be superimposed on the operation phase. A criterion for stopping the learning phase may be provided, for example when each of the calculated interference parameters stabilizes near a mean value.

Operations Phase:

The operation phase is based on the following reasoning:

1) Let M be a vector of true magnetic measurements, i.e., tainted by interference, including all the components $Bz_i$:

$$M=\{Bz1,Bz2,Bz3,Bz4,Bz5,Bz6,Bz7,Bz8\}$$

2) Let S be a vector of magnetic measurements without interference, including components $CBz_i$ which would be measured if there was no interference:

$$S=\{CBz1,CBz2,CBz3,CBz4,CBz5,CBz6,CBz7,CBz8\}$$

We can write:

$$M=MINT\cdot S$$

For this purpose, it is assumed that the MINT matrix depends only on the topology of the circuit breakers and not on the currents flowing through them. The person skilled in the art will recognize in this assumption the fact that the fields are not coupled from one circuit breaker to another. This assumption has been verified by laboratory measurements.

In other words, the vector of true magnetic measurements M, is equal to the product of the vector of interference-free magnetic measurements S and the interference matrix MINT. This means that each component $Bz_i$ measured on a circuit breaker $D_i$ is equal to the interference-free component $CBz_i$ of the circuit breaker to which is added the sum of the interferences, i.e., the sum of the products of each interference parameter $dBz_i/dBz_j$ by the values of the corresponding interference-free component $CBz_j$ measured on another circuit breaker, e.g.:

$$Bz1=CBz1+CBz2*dBz1/dBz2+CBz3*dBz1/dBz3+$$
$$CBz4*dBz1/dBz4+CBz5*dBz1/dBz5+$$
$$CBz6*dBz1/dBz6+CBz7*dBz1/dBz7+$$
$$CBz8*dBz1/dBz8$$

It is therefore possible to write:

$$S=MINT^{-1}\cdot M$$

$MINT^{-1}$ being the inverse matrix of the matrix MINT.

Thus, during the operation phase, the processor PRC calculates the inverse matrix $MINT^{-1}$ and uses it to transform the vector of true magnetic measurements M into the vector of interference-free magnetic measurements S. The calculation of the vector S provides the processor PRC with the corrected values $CBz_i$ of the measured components $Bz_i$, from which it deduces the value of the current flowing through each circuit breaker.

Since the MINT matrix may be ill-conditioned, its inversion may be computed using methods such as the pseudo-inverse method, or SVD (Singular Value Decomposition) methods which allow to obtain an exact or approximate value of the inverse matrix $MINT^{-1}$. By "ill-conditioned" it is meant that the matrix may be affected by measurement uncertainties. In this case, the calculation of the inverse matrix may exhibit very small ratios of values producing random values. The SVD method, for example, involves setting the low values to 0 and forming a pseudo-inverse matrix which takes into account the zero values, this method being well known to the person skilled in the art.

It will also be clear to the skilled person that the calculation of the vector S by means of the inverse matrix $MINT^{-1}$ is likely to be carried out according to various other mathematical methods or calculation algorithms, the matrix being only a simple mathematical tool. For example, a method using neural algorithms could be implemented.

This calculation allows to subtract from each measured component $Bz_i$ the sum of the products of the other components $Bz_j$ by their respective interference parameters, to obtain the corrected component $CBz_i$. Indeed, if $C_{i,j}$ denotes the terms of the inverse matrix, the following may be written:

$$CBzi=\Sigma(j=1\rightarrow N2)\cdot C_{i,j}\cdot Bzj$$

with j ranging from 1 to N2, N2 being the number of circuit breakers, and i the rank of the circuit breaker considered.

Thus, the corrected components $CBz_i$ are each obtained as a linear combination of the measured components $Bz_j$, for j varying from 1 to N2. The coefficients of these linear combinations are generally negative for magnetic fields that always have the same orientation, unless one considers the case where the currents are 180° out of phase from one circuit breaker to the other under the effect of a purely capacitive load, which appears impossible in practice.

The process just described may optionally also be applied to the components $Bx_i$, $By_i$, for a more accurate field measurement, especially in applications where the circuit breakers have a component $Bz_i$ that is not significantly greater than the components $Bx_i$ and $By_i$. Similarly, if it happens that some circuit breaker designs have a component $Bx_i$ or $By_i$ that is greater than the other two, that component may be preferentially used instead of the component $Bz_i$, if it is not desired to use all three components. Two out of three components could also be used, instead of one or all three at once.

It will be clear to the person skilled in the art that the present invention is susceptible of various other alternatives and embodiments. In particular, it is not excluded that there may exist on the market models of circuit breakers having a concentration point of the magnetic field located at another point than in the vicinity of the reset lever, for example on another wall of the circuit breaker. In this case, modules according to the invention could have another shape than the one shown in the drawings.

In an embodiment of a module according to the invention, a magnetic shield is made around each magnetometer, by means of metal preferably having good magnetic permeability. The shielding surrounds the magnetometer $M_i$ and thus allows the component $Bz_i$ to pass perpendicular to the base 31 (FIG. 1) of the module 30-$i$, which is emitted by the circuit breaker on which the module 30-1 is arranged (FIG. 2), while blocking the components Bx$_i$ and By$_i$ emitted by the other circuit breakers (FIG. 9), which propagate parallel to the base 31. In this case, the interference phenomenon is strongly attenuated thanks to the shielding that each module includes. It may then no longer be necessary to calculate corrected components CBz$_i$, while the components Bz$_i$ may be used by the processor PRC without correction after suppression of the DC component of the earth's magnetic field. The provision of the magnetic shielding may also be combined with the correction of the components Bz$_i$, for an even more accurate measurement.

The invention claimed is:

1. A method of monitoring the operating state of a set of circuit breakers, each circuit breaker comprising a protective coil and having a wall through which a magnetic field emitted by the coil passes, the method comprising the steps of:
arranging on the wall of each circuit breaker a synchronous triaxial digital magnetometer on a semiconductor chip, each magnetometer comprising magnetic field measuring means and an internal temperature sensor, and a data output for providing magnetic field and temperature measurements,
the method comprising the steps of:
cyclically and synchronously reading, at successive times, the temperatures provided by the magnetometers,
from the temperatures measured by the magnetometers and a value of the ambient temperature, determining, for each circuit breaker, whether an internal heating temperature of the circuit breaker reaches a first temperature threshold which may be representative of an anomaly in the operating state of the circuit breaker, and
emitting an alarm of a first type when the internal heating temperature of at least one circuit breaker reaches the first temperature threshold.

2. The method of claim 1, wherein the value of the ambient temperature is estimated from the temperatures measured by the magnetometers.

3. The method of claim 2, wherein the value of the ambient temperature is selected from the following values:
an average value of the temperatures measured at the same time by the magnetometers,
a weighted average value of the temperatures measured at the same time by the magnetometers,
the lowest of the temperatures measured at the same time by the magnetometers, or
a combination of at least two of the three previous values.

4. The method of claim 1, comprising at least the first of the following two steps:
for each magnetometer and circuit breaker associated with the magnetometer, subtracting the ambient temperature value from each temperature measured by the magnetometer, to obtain a first estimate of the internal heating temperature of the circuit breaker, and
for each magnetometer and circuit breaker associated with the magnetometer, subtracting from each first estimate of the internal heating temperature of the circuit breaker, the mean value of a plurality of estimates of the internal heating temperature of the circuit breaker calculated at different times, in order to obtain a second estimate of the internal heating temperature of the circuit breaker.

5. The method of claim 1, comprising the steps of:
determining, for each circuit breaker, whether the internal heating temperature of the circuit breaker reaches a second temperature threshold, and
emitting an alarm of a second type if the internal heating temperature reaches a second temperature threshold higher than the first temperature threshold.

6. The method of claim 1 comprising the steps of:
cyclically and synchronously reading, at successive times, the values of at least one component of the magnetic field measured by each magnetometer, representative of the field emitted by the coil of the circuit breaker with which each circuit breaker is associated, and
evaluating the value of a current flowing through each circuit breaker from the measured magnetic field component.

7. The method of claim 6, wherein the alarm of the first type is issued only if the circuit breaker has a current flowing through it that is less than a current threshold for which its internal heating temperature should not exceed the first temperature threshold.

8. The method according to claim 6, wherein when the internal heating temperatures of two adjacent circuit breakers each reach the first temperature threshold, the alarm of the first type is not issued for the one of the two circuit breakers that has not had any current flowing through it for a determined time.

9. The method of claim 6, comprising the following steps for each circuit breaker:
cyclically evaluating the current flowing through the circuit breaker,
evaluating, in an observation time window of a few hours to a few days, a rate of operation of the circuit breaker which is a function of the number of periods when the circuit breaker is crossed by a current, and the duration of each of these periods,
monitoring the variation of the rate of operation of the circuit breaker within the observation time window, and
issuing an alarm of a third type indicating a possible malfunction of equipment electrically supplied by the circuit breaker if the variation of the rate of operation of the circuit breaker exceeds a specified variation threshold.

10. The method of claim 9, comprising, when the conditions for issuing the first type alarm are met for two adjacent circuit breakers, a step of comparing the operating rates of each circuit breaker to identify the circuit breaker with the higher probability of abnormality of its operating state, the temperature rise of one of the circuit breakers being caused by the temperature rise of the other circuit breaker, and wherein the alarm of the first type is issued only for the circuit breaker having the highest probability of abnormality of its operating state.

11. The method according to claim 1, wherein issuing an alarm comprises one or a combination of the following actions: displaying information on a control screen, sending an electronic message to a recipient, activating an indicator light or triggering an audible alarm.

12. A device for monitoring the operating state of a set of circuit breakers, each circuit breaker comprising a protective coil and having a wall through which a magnetic field emitted by the coil passes, the device comprising:
a set of synchronous triaxial digital magnetometers on semiconductor chips, each magnetometer being arranged on the wall of a circuit breaker and comprising magnetic field measuring means, an internal temperature sensor and a data output for providing magnetic field and temperature measurements, and a control circuit connected to the magnetometers, characterized in that the control circuit is configured to:

cyclically and synchronously read, at successive times, the temperatures measured by the magnetometers, from the temperatures measured by the magnetometers and a value of the ambient temperature, determine, for each circuit breaker, whether an internal heating temperature of the circuit breaker reaches a first temperature threshold which may be representative of an anomaly in the operating state of the circuit breaker, and emit an alarm of a first type when the internal heating temperature of at least one circuit breaker reaches the first temperature threshold.

13. The device of claim 12, wherein the control circuit is configured to estimate the value of the ambient temperature from the temperatures measured by the magnetometers.

14. The device of claim 12, wherein the control circuit is configured to perform at least the first of the following two steps, for each magnetometer and circuit breaker associated with the magnetometer:

subtracting the ambient temperature value from each temperature measured by the magnetometer, to obtain a first estimate of the internal heating temperature of the circuit breaker, and subtracting from each first estimate of the internal heating temperature of the circuit breaker, the average value of a plurality of estimates of the internal heating temperature of the circuit breaker calculated at different times, in order to obtain a second estimate of the internal heating temperature of the circuit breaker.

15. The device according to claim 12, wherein the control circuit is configured to emit, in addition to the alarm of the first type, an alarm of a second type when the internal heating temperature of at least one circuit breaker reaches a second temperature threshold higher than the first temperature threshold.

16. The device of claim 12, wherein the control circuit is configured to:

cyclically and synchronously read, at successive times, the values of at least one component of the magnetic field measured by each magnetometer, representative of the field emitted by the coil of the circuit breaker with which each circuit breaker is associated, evaluate the value of a current flowing through each circuit breaker from the measured magnetic field component.

17. The device according to claim 16, wherein the control circuit is configured to issue the alarm of the first type only if the circuit breaker has a current flowing through it that is less than a current threshold for which its internal heating temperature should not exceed the first temperature threshold.

18. The device according to claim 16, wherein when the estimated internal heating temperatures of two adjacent circuit breakers each reach the first temperature threshold, the control circuit is configured not to issue the alarm of the first type for the one of the two circuit breakers that has not had any current flowing through it for a determined time.

19. The device of claim 16, wherein the control circuit is configured to perform the following steps for each circuit breaker:

cyclically evaluating the current through the circuit breaker, calculating, in a sliding time window of observation at least equal to the last 24 hours, a rate of operation of the circuit breaker which is a function of the number of periods during which the circuit breaker is crossed by a current, and of the duration of each of these periods, monitoring the variation of the circuit breaker operating rate over time, within the sliding time window of observation, issuing a third type of alarm if the variation in the rate of operation of the circuit breaker exceeds a specified variation threshold.

20. The device of claim 19, wherein when the conditions for issuing the first type alarm are met for two adjacent circuit breakers, the control circuit is configured to compare the operating rates of each circuit breaker to identify the circuit breaker with the higher probability of abnormality of its operating condition, wherein the temperature rise of one of the circuit breakers may be caused by the temperature rise of the other circuit breaker, and issue the first type alarm only for the circuit breaker having the highest probability of abnormality of its operating condition.

21. The device of claim 12, wherein the control circuit is configured to issue an alarm by performing one or a combination of the following actions: displaying information on a control screen, sending an electronic message to a recipient, activating an indicator light, or triggering an audible alarm.

* * * * *